(12) United States Patent
Ko

(10) Patent No.: US 11,322,222 B2
(45) Date of Patent: May 3, 2022

(54) MEMORY DEVICE

(71) Applicant: Realtek Semiconductor Corporation, Hsinchu (TW)

(72) Inventor: Hsin-Cheng Ko, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 17/169,896

(22) Filed: Feb. 8, 2021

(65) Prior Publication Data

US 2021/0358560 A1   Nov. 18, 2021

(30) Foreign Application Priority Data

May 18, 2020 (TW) .................................. 109116444

(51) Int. Cl.
*G11C 29/44* (2006.01)
*G11C 29/02* (2006.01)
*G11C 29/10* (2006.01)
*G11C 29/12* (2006.01)

(52) U.S. Cl.
CPC ............ *G11C 29/44* (2013.01); *G11C 29/027* (2013.01); *G11C 29/10* (2013.01); *G11C 2029/1204* (2013.01)

(58) Field of Classification Search
CPC ........ G11C 29/44; G11C 29/027; G11C 29/10
See application file for complete search history.

(56) References Cited

U.S. PATENT DOCUMENTS

| 2012/0155186 A1* | 6/2012 | Chokan | G11C 16/0483 365/185.22 |
| 2013/0272080 A1* | 10/2013 | Lin | G11C 29/44 365/200 |
| 2017/0206124 A1* | 7/2017 | Lim | G11C 11/5628 |
| 2019/0237154 A1* | 8/2019 | Choi | G11C 29/4401 |

* cited by examiner

*Primary Examiner* — Han Yang
(74) *Attorney, Agent, or Firm* — Locke Lord LLP; Tim Tingkang Xia, Esq.

(57) ABSTRACT

A memory device includes at least one first register, a memory circuit, an analyzing circuit, and a control circuit. The memory circuit includes a plurality of bit cells. The analyzing circuit is configured to perform an analyzing process on the bit cells to generate an analyzing result. If the analyzing result indicates that a first bit cell of the bit cells fails, the control circuit establishes a repair process by controlling data to be written into the at least one first register and controlling the data to be read out from the at least one first register.

18 Claims, 4 Drawing Sheets

MEMORY DEVICE

RELATED APPLICATIONS

This application claims priority to Taiwanese Application Serial Number 109116444, filed May 18, 2020, which is herein incorporated by reference.

BACKGROUND

Technical Field

The present disclosure relates to a memory technology. More particular, it relates to a memory device having a repair mechanism.

Description of Related Art

With developments of memory technology, memory devices are widely used in many technology fields for data storage. Upon different applications (for example, different power consumption), the memory devices can be operated under different environments. A failed bit cell of the memory device can affect the normal operation of the memory device.

SUMMARY

Some aspects of the present disclosure are to provide a memory device. The memory device includes at least one first register, a memory circuit, an analyzing circuit, and a control circuit. The memory circuit includes a plurality of bit cells. The analyzing circuit is configured to perform an analyzing process on the bit cells to generate an analyzing result. If the analyzing result indicates that a first bit cell of the bit cells fails, the control circuit establishes a repair process by controlling data to be written into the at least one first register and controlling the data to be read out from the at least one first register.

Some aspects of the present disclosure are to provide a memory device. The memory device includes a memory circuit, an analyzing circuit, and a control circuit. The memory circuit includes a plurality of bit cells. The analyzing circuit is configured to perform an analyzing process on the bit cells to generate an analyzing result. If the analyzing result indicates that a first bit cell of the bit cells fails, the control circuit adjusts an operating voltage of the memory device to generate an adjusted operating voltage, and the memory device operates according to the adjusted operating voltage.

DETAILED DESCRIPTION

The following embodiments are disclosed with accompanying diagrams for detailed description. For better understanding, many details of practice are explained in the following descriptions. However, it should be understood that these details of practice do not intend to limit the present disclosure. That is, these details of practice are not necessary in part of embodiments of the present embodiments.

In the present disclosure, "connected" or "coupled" may refer to "electrically connected" or "electrically coupled." "Connected" or "coupled" may also refer to operations or actions between two or more elements.

Figure 1:
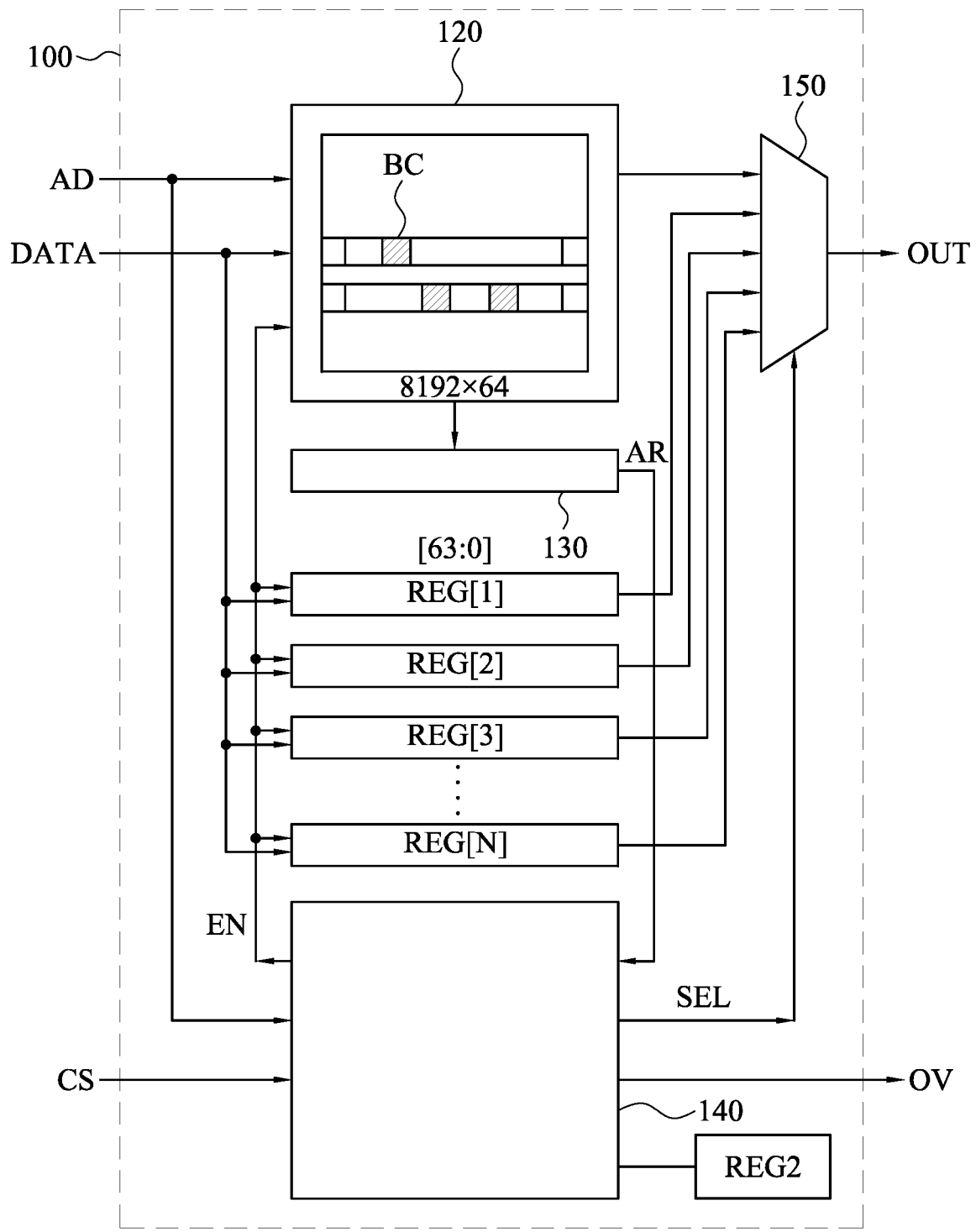
FIG. 1 is a schematic diagram of a memory device according to some embodiments of the present disclosure.

Reference is made to FIG. 1. FIG. 1 is a schematic diagram of a memory device 100 according to some embodiments of the present disclosure. As illustrated in FIG. 1, the memory device 100 includes a memory circuit 120, an analyzing circuit 130, a control circuit 140, a selector circuit 150, and a register REG2. The memory device 100 further includes registers REG[1]-REG[N], wherein N is a positive integer equal to or greater than 1.

The memory circuit 120 is coupled to the analyzing circuit 130, the control circuit 140, and the selector circuit 150. The analyzing circuit 130 is coupled to the control circuit 140. The control circuit 140 is coupled to the selector circuit 150, the registers REG[1]-REG[N], and the register REG2. The registers REG[1]-REG[N] are coupled to the selector circuit 150.

The memory circuit 120 includes bit cells BC. A bit cell is also called a memory cell. In this example, the memory circuit 120 can include 8192×64 bit cells BC. In other words, the bit cells BC are arranged in an array with 8192 rows and 64 columns. The quantity of the bit cells BC in the memory circuit 120 is only for illustration, and various quantities are within the contemplated scopes of the present disclosure.

The analyzing circuit 130 is configured to perform an analyzing process on the bit cells BC in the memory circuit 120 to determine if any of the bit cells BC fails so as to generate an analyzing result AR. If one of the bit cells BC fails, it indicates that data stored in this bit cell BC cannot be read out or data cannot be written into this bit cell BC accurately. An address (i.e., a failure address) of this bit cell BC can be carried in the analyzing result AR.

The control circuit 140 is configured to receive the analyzing result AR. As described above, the control circuit 140 receives the analyzing result AR which carries the address (failure address) of the bit cell BC. In some embodiments, the control circuit 140 stores the analyzing result AR into the register REG2. In other words, the register REG2 can store the address of the bit cells BC that endures a failure.

When an external processor (not shown) performs a write process on the memory device 100, the external processor sends a control signal CS to the control circuit 140 to power-up/turn-on the control circuit 140. The external processor can send a write address AD to the memory circuit 120 and the control circuit 140 and send data DATA (i.e., the data that awaits to be written in the memory) to the memory circuit 120. The control circuit 140 determines whether the write address AD is one of the failure addresses according to the analyzing result AR. For example, the control circuit 140 compares the write address AD with the failure addresses carried in the analyzing result AR to determine whether the write address AD is one of the failure addresses. If the write address AD is one of the failure addresses, the control circuit 140 sends an enable signal EN to enable a corresponding register (for example, the register REG[1]) and write the data DATA into the register REG[1]. It can avoid the data DATA being incorrectly written into the failure address in the memory circuit 120, such that the memory device 100 can operate normally.

When the external processor performs a read process on the memory device 100, the external processor sends a read address AD to the memory circuit 120 and the control circuit 140. If the control circuit 140 determines that the read address AD is one of the failure addresses, the control circuit 140 sends a selection signal SEL to a selection port of the selector circuit 150 based on the read address AD. The selector circuit 150 selects a corresponding register (e.g., the register REG[1]) according to the selection signal SEL and reads out the data stored in the register REG[1] as an output data OUT.

Based on the descriptions above, when one bit cell fails, the data DATA is written into a register (for example, the register REG[1]) and is read out from that register (for example, the register REG[1]). In other words, a path of the write process and a path of the read process are redirect to the registers REG[1]-REG[N] (the data DATA does not go to the memory circuit 120) to establish a repair process. The "repair process" refers to the described mechanism that maintains the operation of the memory device 100 even if failures are found on some of the bit cells in the memory circuit 120.

In some embodiments, the control circuit 140 is implemented by a processor or a micro-controller, but the present disclosure is not limited thereto. In some embodiments, the selector circuit 150 is implemented by a multiplexer, but the present disclosure is not limited thereto.

In some related arts, a backup memory circuit with one column capacity is provided in a memory device. With this configuration, when a bit cell in the memory device fails, this column backup memory circuit can be utilized to perform the repair process. In other words, data can be written into this backup memory circuit or be read out from this backup memory circuit. However, from a perspective of chip layouts, such backup memory circuit cannot be flexibly arranged in the fragmented spaces on the chip so it can limit the entire layout.

Compared to the related approaches above, the memory device 100 of the present disclosure utilizes the registers REG[1]-REG[N] as alternative storage for the repair process. Since such registers can be arranged in the fragmented spaces on the chip, the present disclosure can improve the flexibility of the circuit layout without altering the layout of other components.

In some embodiments, if the write address AD does not direct to a fail bit cell, the control circuit 140 sends the enable signal EN to enable the memory circuit 120 in order to write the data DATA into the bit cell BC corresponding to the write address AD in the memory circuit 120. Similarly, if the read address AD does not direct to a fail bit cell, the selector circuit 150 directly reads out the data from the memory circuit 120 to generate the output data OUT.

Capacity of each of the registers REG[1]-REG[N] may be equal to a row capacity of the memory circuit 120. In this example, a row capacity of the memory circuit 120 can be 64 bits, but the present disclosure is not limited thereto. In a practical case, if a bit cell BC in the first row of the memory circuit 120 fails, when the external processor performs the write process and the read process to the bit cells BC in the first row, the control circuit 140 can establish the repair process by controlling the register REG[1] so that the path of the write process and the path of the read process are redirected to the register REG[1] (the data DATA does not go to the memory circuit 120). In another case, if this failure bit cell BC is in the second row, when the external processor performs the write process and the read process on the bit cells BC in the second row, the control circuit 140 can establish the repair process by controlling the register REG[2] so that the path of the write process and the path of the read process are redirected to the register REG[2] (the data DATA does not go to the memory circuit 120). The operations that the failure bit cell BC is in other rows can be similar to the above embodiment.

In some other embodiments, the capacity of each of the registers REG[1]-REG[N] may be equal to a column capacity of the memory circuit 120.

In some embodiments, the memory device 100 can perform the analyzing process discussed above according to different operating voltages OV at test phases to record failure addresses corresponding to each operating voltage OV in the register REG2. Thus, when the external processor performs the write process and the read process on the memory circuit 120, the memory circuit 120 can be operated under a preferred operating voltage OV (an operating voltage OV that produces a minimum number of failure addresses). The control circuit 140 can control the registers REG[1]-REG[N] to perform the repair process for the failure addresses stored in the register REG2.

In some embodiments, the operating voltages OV for the analyzing process can include three voltage values. For example, the memory device 100 usually operates under a preferred operating voltage. The operating voltages OV for the analyzing process can include the preferred operating voltage, a high voltage higher than the preferred operating voltage, and a low voltage lower than the preferred operating voltage. Thus, if the operating voltage OV of the memory device 100 slightly shifts, the memory device 100 can still operate in a normal manner. However, the present disclosure is not limited to three operating voltages OV. In some other embodiments, the operating voltages OV for the analyzing process include more than three voltage values.

Figure 2:
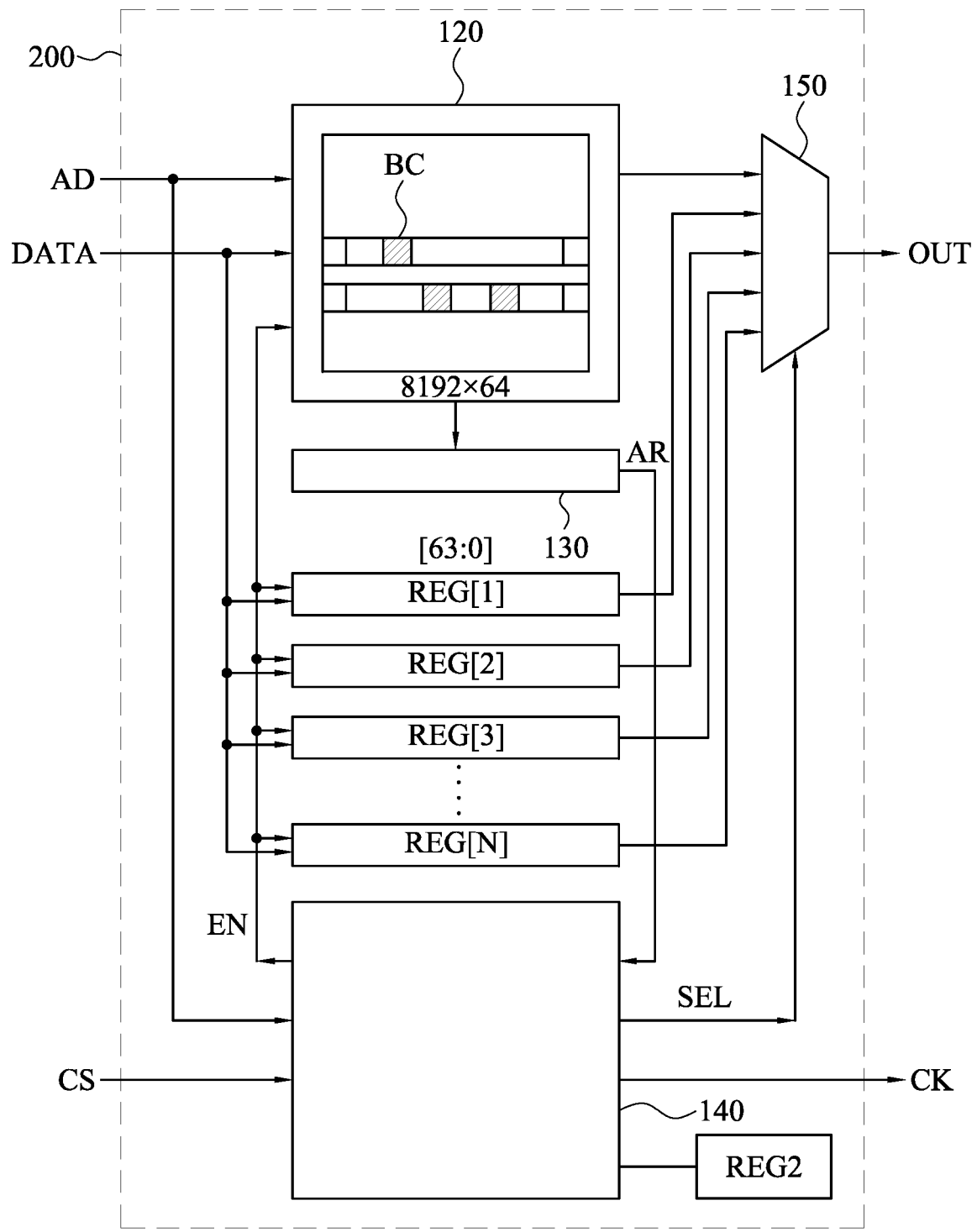
FIG. 2 is a schematic diagram of a memory device according to some embodiments of the present disclosure.

Reference is made to FIG. 2. FIG. 2 is a schematic diagram of a memory device 200 according to some embodiments of the present disclosure. A major difference between the memory device 200 in FIG. 2 and the memory device 100 in FIG. 1 is that the memory device 200 in FIG. 2 can adjust a transmission rate (can be known as "margin adjustment") and perform the aforementioned analyzing process according to the different adjusted transmission rates at test phases. A "transmission rate" can be understood as the maximum clock rates that the write process and the read process can reach. For example, when a higher transmission rate is set, the memory device 200 can perform the write process and the read process with a higher maximum clock rate and the memory device 200 can work in a higher frequency. However, a higher frequency of the memory device 200 can produce more bit cell BC fails.

After the memory device 200 performs the aforementioned analyzing process according to the different transmission rates CK at the test phases, failure addresses corresponding to these transmission rates CK can be stored in the register REG2. When the external processor performs the write process and the read process on the memory circuit 120, the memory circuit 120 can operate at a preferred transmission rate CK (which produces the minimum number of failure addresses). The control circuit 140 can perform the repair process by controlling the registers REG[1]-REG[N] for each of the failure addresses stored in the register REG2.

Some operations of the memory device 200 in FIG. 2 are similar to the operations of the memory device 100 in FIG. 1 and will not be repeated.

Figure 3:
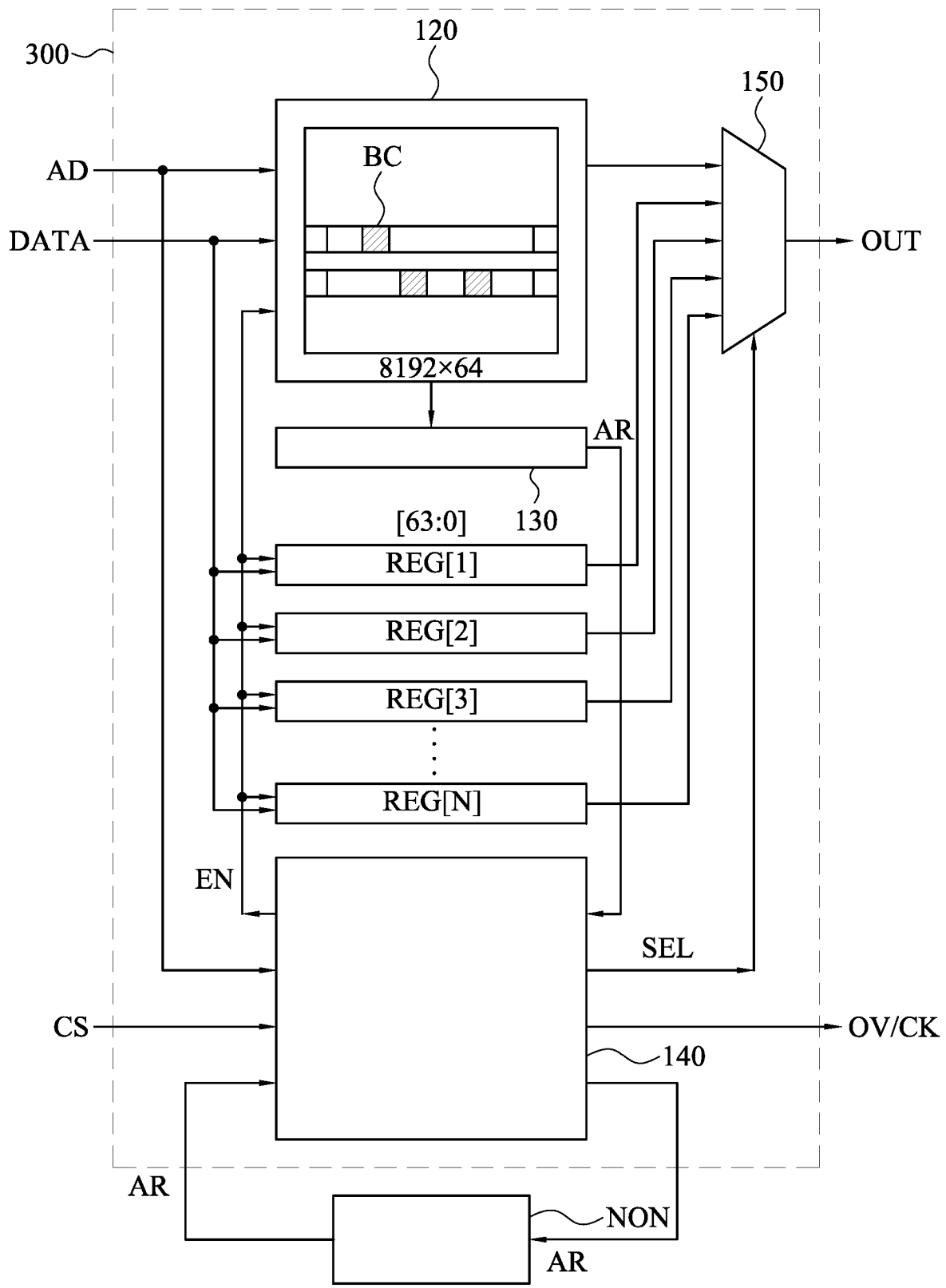
FIG. 3 is a schematic diagram of a memory device according to some embodiments of the present disclosure.

Reference is made to FIG. 3. FIG. 3 is a schematic diagram of a memory device 300 according to some embodiments of the present disclosure. A major difference between the memory device 300 in FIG. 3 and the memory device 100 in FIG. 1 is that the memory device 300 in FIG. 3 includes a non-transitory storage circuit NON.

In some embodiments, the failure addresses corresponding to different test conditions (e.g., different operating voltages OV/different transmission rates CK) can be stored in the non-transitory storage circuit NON. When the memory device 300 is powered off, data stored in the non-transitory storage circuit NON can be kept. Accordingly, when the external processor performs the write process and the read process on the memory circuit 120 at the time that the memory device 300 is powered on, the repair process for the failure addresses stored in the non-transitory storage circuit NON can be performed by using the registers REG[1]-REG[N].

In some embodiments, the non-transitory storage circuit NON can be implemented by a fuse, but the present disclosure is not limited thereto. Various non-transitory storage circuits are within the contemplated scopes of the present disclosure.

Some operations of the memory device 300 in FIG. 3 are similar to the operations of the memory device 100 in FIG. 1 and will not be repeated.

Figure 4:
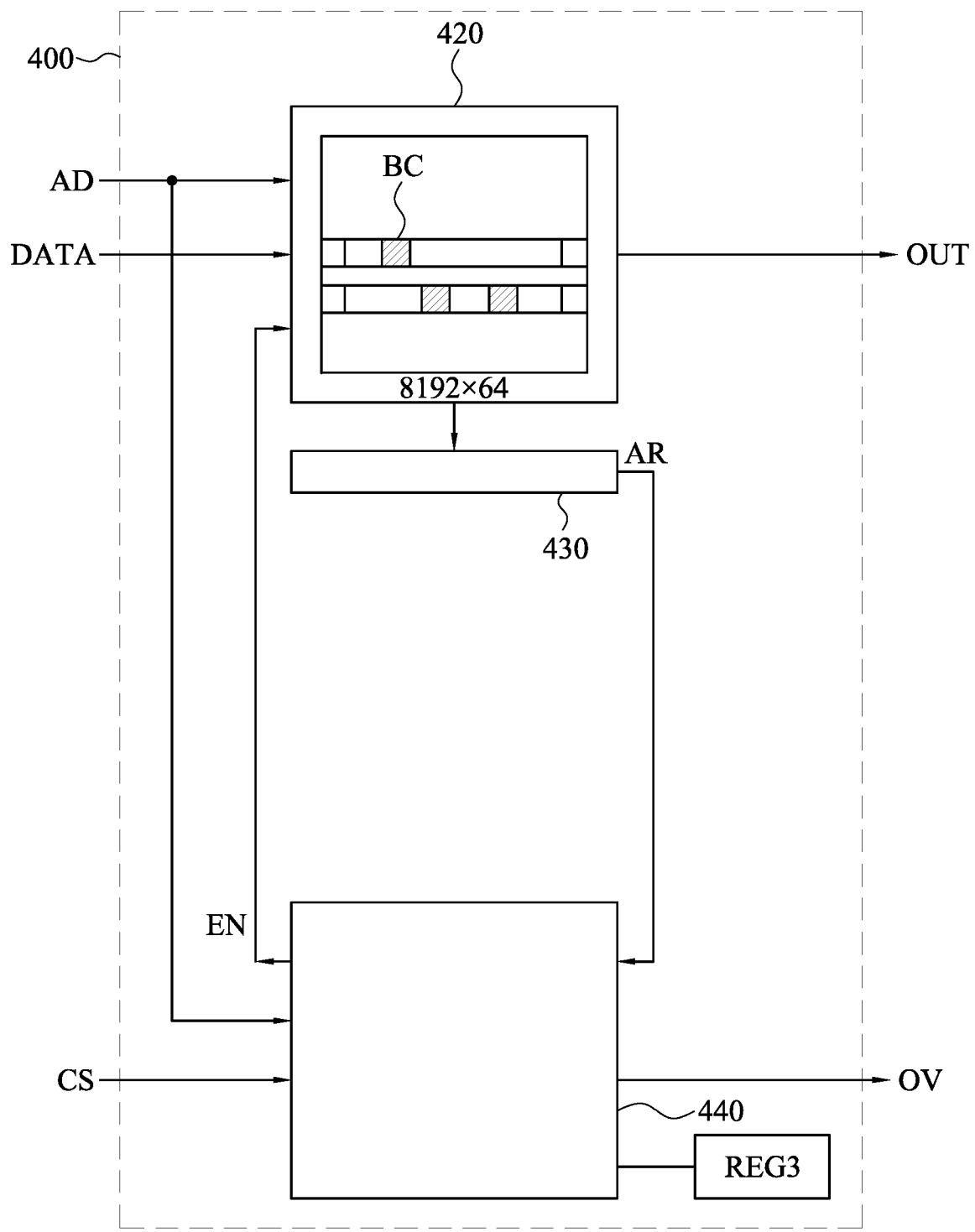
FIG. 4 is a schematic diagram of a memory device according to some embodiments of the present disclosure.

Reference is made to FIG. 4. FIG. 4 is a schematic diagram of a memory device 400 according to some embodiments of the present disclosure. As illustrated in FIG. 4, the memory device 400 includes a memory circuit 420, an analyzing circuit 430, a control circuit 440, and a register REG3.

The memory circuit 420 is coupled to the analyzing circuit 430. The analyzing circuit 430 is coupled to the control circuit 440. The control circuit 440 is coupled to the memory circuit 420 and the register REG3.

The analyzing circuit 430 is configured to perform the analyzing process on the bit cells BC in the memory circuit 420 to determine if any bit cell(s) BC is failed in order to generate an analyzing result AR. When failures are found on some of the bit cells BC, the control circuit 440 can adjust the operating voltage of the memory device 400 (e.g., increase the operating voltage OV such that the bit cells BC in the memory circuit 420 is less likely to fail). The adjustments of the memory device 400 can be applied until an operating voltage OV corresponding to no failure address or less failure addresses is found. In some embodiments, the memory device 400 is set to operate according to the increased operating voltage OV (i.e., the adjusted operating voltage). Thus, the memory device 400 has a lower chance to endure malfunctions.

As described above, the memory device of the present disclosure has a decent repair mechanism and it can ensure the quality of the product.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory device, comprising:
   at least one first register;
   a memory circuit comprising a plurality of bit cells;
   an analyzing circuit configured to perform an analyzing process on the plurality of bit cells to generate an analyzing result; and
   a control circuit, wherein if the analyzing result indicates that a first bit cell of the bit cells fails, the control circuit establishes a repair process by controlling data to be written into the at least one first register and controlling the data to be read out from the at least one first register.

2. The memory device of claim 1, wherein a capacity of the at least one first register is equal to a row capacity of the memory circuit or a column capacity of the memory circuit.

3. The memory device of claim 1, wherein the at least one first register is in a quantity N, and N is a positive integer greater than 1.

4. The memory device of claim 3, further comprising:
   a selector circuit coupled to the N first registers,
   wherein the control circuit is configured to output a selection signal according to the analyzing result, and the selector circuit is configured to read out the data from one of the N first registers according to the selection signal.

5. The memory device of claim 1, wherein the control circuit is configured to enable the at least one first register according to a failure address of the first bit cell and one of a write address and a read address so that the data is written into the at least one first register or read out from the at least one first register.

6. The memory device of claim 5, further comprising:
   a second register configured to store the failure address.

7. The memory device of claim 5, further comprising:
   a non-transitory storage circuit configured store the failure address.

8. The memory device of claim 7, wherein the non-transitory storage circuit comprises a fuse.

9. The memory device of claim 1, wherein the memory device is configured to perform the analyzing process based on a plurality of operating voltages to acquire a plurality of failure addresses, and the control circuit performs the repair process for each of the plurality of failure addresses.

10. The memory device of claim 9, further comprising:
    a second register configured to store the failure addresses.

11. The memory device of claim 9, further comprising:
    a non-transitory storage circuit configured store the failure addresses.

12. The memory device of claim 11, wherein the non-transitory storage circuit comprises a fuse.

13. The memory device of claim 1, wherein the control circuit is further configured to adjust a transmission rate of the memory device to generate a plurality of adjusted transmission rates, and the memory device is configured to perform the analyzing process according to the plurality of adjusted transmission rates to acquire a plurality of failure addresses, and the control circuit performs the repair process for each of the plurality of failure addresses.

14. The memory device of claim 13, further comprising:
a second register configured to store the failure addresses.

15. The memory device of claim 13, further comprising:
a non-transitory storage circuit configured store the failure addresses.

16. The memory device of claim 15, wherein the non-transitory storage circuit comprises a fuse.

17. The memory device of claim 1, wherein if the analyzing result indicates that the first bit cell of the bit cells fails, the control circuit adjusts an operating voltage of the memory device to generate an adjusted operating voltage, and the memory device operates according to the adjusted operating voltage.

18. The memory device of claim 17, wherein the control circuit increases the operating voltage to generate the adjusted operating voltage.

* * * * *